US009536806B2

(12) United States Patent
Ebert et al.

(10) Patent No.: US 9,536,806 B2
(45) Date of Patent: Jan. 3, 2017

(54) MULTI-COMPONENT COOLING ELEMENT

(75) Inventors: Thomas Ebert, Aachen (DE);
Hermann Hahn, Dusseldorf (DE)

(73) Assignee: IQ evolution GmbH, Düsseldorf (DE)

( * ) Notice: Subject to any disclaimer, the term of this patent is extended or adjusted under 35 U.S.C. 154(b) by 1920 days.

(21) Appl. No.: 12/438,336

(22) PCT Filed: Nov. 11, 2008

(86) PCT No.: PCT/EP2008/009651
§ 371 (c)(1),
(2), (4) Date: Feb. 20, 2009

(87) PCT Pub. No.: WO2009/062732
PCT Pub. Date: May 22, 2009

(65) Prior Publication Data
US 2010/0175853 A1  Jul. 15, 2010

(30) Foreign Application Priority Data
Nov. 16, 2007 (EP) .................................. 07 022 269

(51) Int. Cl.
F28F 7/02 (2006.01)
F28F 13/00 (2006.01)
(Continued)

(52) U.S. Cl.
CPC ........... *H01L 23/473* (2013.01); *B22F 1/0003* (2013.01); *B22F 3/1055* (2013.01);
(Continued)

(58) Field of Classification Search
CPC . H01L 23/473; F28F 2013/005; F28F 21/086; F28F 2255/06; B22F 1/0003
(Continued)

(56) References Cited

U.S. PATENT DOCUMENTS 3,826,892 A * 7/1974 Draugelis et al. ............ 219/216
4,056,823 A * 11/1977 Thornburg ................... 346/76.1
(Continued)

FOREIGN PATENT DOCUMENTS

DE         4315580 A1 * 11/1994
DE    102004053874       5/2006
(Continued)

OTHER PUBLICATIONS

European Search Report for U.S. Pat. No. 07022269.0, 5 pages, Dated Apr. 17, 2008.

*Primary Examiner* — Allen J. Flanigan
*Assistant Examiner* — Jason Thompson
(74) *Attorney, Agent, or Firm* — Michael Best & Friedrich LLP

(57) ABSTRACT

The invention relates to a micro cooling element (1) with a mounting surface (2) for a component to be cooled, in particular a semiconductor component, which has within it a micro cooling structure (3) which is connected by connection channels (4) to at least one inflow opening (4a) and at least one outflow opening (4b) by means of which a cooling medium can be supplied to the micro cooling structure (3) or be discharged from the latter, and which is characterized in that it is formed from at least two different powdery and/or liquid, in particular metallic and/or ceramic, materials or material mixtures (10) while maintaining a monolithic structure, wherein regions of different stresses (I, II) of the micro cooling element (1) are built by a powdery and/or liquid, in particular metallic and/or ceramic materials or material mixtures (10) being adapted to the stress respectively.

The invention further relates to an apparatus and a process for producing a micro cooling element according to the invention.

5 Claims, 1 Drawing Sheet

(51) Int. Cl.
*F28F 3/12* (2006.01)
*H01L 23/473* (2006.01)
*H01L 21/48* (2006.01)
*B22F 1/00* (2006.01)
*B22F 3/105* (2006.01)

(52) U.S. Cl.
CPC .. *H01L 21/4871* (2013.01); *B22F 2003/1056* (2013.01); *H01L 2924/0002* (2013.01); *Y02P 10/295* (2015.11); *Y10T 29/4935* (2015.01); *Y10T 29/52* (2015.01)

(58) Field of Classification Search
USPC ... 165/80.4, 146, 104.26; 361/699; 428/547, 428/546, 548, 577, 570, 615
See application file for complete search history.

(56) References Cited

U.S. PATENT DOCUMENTS

| | | | |
|---|---|---|---|
| 4,214,906 A * | 7/1980 | Langer et al. | 419/6 |
| 4,888,247 A * | 12/1989 | Zweben et al. | 428/105 |
| 4,900,635 A * | 2/1990 | Bowen et al. | 428/547 |
| 5,038,132 A * | 8/1991 | Lindblom et al. | 338/307 |
| 5,105,429 A * | 4/1992 | Mundinger et al. | 372/34 |
| 5,205,348 A * | 4/1993 | Tousignant et al. | 165/46 |
| 5,523,049 A * | 6/1996 | Terpstra et al. | 419/36 |
| 5,975,410 A * | 11/1999 | Slattery et al. | 228/189 |
| 6,248,290 B1 * | 6/2001 | Kuwabara | 419/6 |
| 2003/0173720 A1 * | 9/2003 | Musso et al. | 264/635 |
| 2004/0183556 A1 * | 9/2004 | Wada et al. | 324/754 |
| 2005/0039885 A1 * | 2/2005 | Vaidyanathan et al. | 165/80.4 |
| 2006/0114013 A1 * | 6/2006 | Kabbani | 324/760 |
| 2006/0124281 A1 * | 6/2006 | Rosenfeld et al. | 165/104.26 |
| 2006/0157221 A1 * | 7/2006 | Ebert | 165/80.2 |
| 2006/0227827 A1 * | 10/2006 | Kawanishi et al. | 372/36 |
| 2007/0017658 A1 * | 1/2007 | Lehman et al. | 165/80.4 |
| 2007/0062674 A1 * | 3/2007 | Ippoushi et al. | 165/80.4 |
| 2007/0141370 A1 * | 6/2007 | Kerber | 428/469 |
| 2007/0272724 A1 * | 11/2007 | Christopherson | 228/2.1 |
| 2010/0314072 A1 * | 12/2010 | Lee et al. | 165/80.2 |

FOREIGN PATENT DOCUMENTS

| | | |
|---|---|---|
| EP | 0468467 | 1/1992 |
| EP | 1672690 | 6/2006 |
| FR | 2841805 | 1/2004 |

* cited by examiner

MULTI-COMPONENT COOLING ELEMENT

CROSS-REFERENCE TO RELATED APPLICATIONS

This patent application is a national stage filing under 35 U.S.C. 371 of International Application No. PCT/EP2008/009651, filed 14 Nov. 2008, and claims priority to European Patent Application No. 07 022 269.0, filed 16 Nov. 2007, the entire contents of which are incorporated herein by reference.

BACKGROUND OF THE INVENTION

The present invention relates to a micro cooling element with a mounting surface for a component to be cooled, in particular a semiconductor component which has within it a micro cooling structure which is connected by connection channels to at least one inflow opening and at least one outflow opening by means of which a cooling medium can be supplied to the micro cooling structure or be discharged from the latter. The present invention further relates to a process and an apparatus for producing this type of micro cooling element.

Micro cooling elements of the type specified above are known and described, for example, in EP 1 672 690. The object of the micro cooling element described in this publication is to achieve improved heat discharge in the region of the mounting surfaces for electronic components. For more homogeneous heat distribution one needs to find a possibility for reducing the minimum outer wall thicknesses in the region of the mounting surface of the component to be cooled without making any sacrifices with regard to insurance against leakages. This is made possible by the cooling element being produced by means of selective laser melting, and so having a monolithic structure which has the advantage in relation to the micro cooling elements with a layered structure that by reducing the wall thicknesses, the feared density problems arising from joints between the layers to be welded together are reduced. A further advantage of using selective laser melting for the production of the cooling element according to the prior art is that with this method, complex internal structures, for example in the form of oval channel cross-sections within the cooling element, can be produced.

In order to realise certain properties of the component to be produced a decision must however be made regarding the material powder to be used in consideration of the advantages and disadvantages of the individual materials. In the known prior art the choice is restricted to one specific material or one corresponding material alloy for the production of the overall component. This requires an appraisal of which material property is essential for the application of the component to be produced and with regard to which parameters must be accepted upon the basis of the restrictions of the latter. The choice of just one material therefore basically constitutes a compromise between the requirements which are also substantially different within the component. As an example of this, it is stated that a micro cooling element should have erosion-resistant properties in the region of the flow-through of the cooling medium, but on the other hand extremely high mechanical stability in the region of its outer limit, and good heat conductivity and the best possible adapted expansion coefficient and resistance against electrocorrosion in the region of the mounting surface for the component to be cooled. Since no material or material alloy combines all of these properties, in the prior art, due to the requirements identified by the customer, one must among other things also decide whether the expansion adaptation to the component to be cooled and resistance against electrocorrosion should be pushed to the background in favour of the cooling capability and erosion resistance, or vice versa.

SUMMARY

It is therefore the object of the present invention to provide a micro cooling element which can be adapted to the changing requirements within the component.

This object is achieved according to the invention in that the micro cooling element is formed from at least two different powdery and/or liquid, in particular metallic and/or ceramic materials or material mixtures while maintaining a monolithic structure. Monolithic in accordance with the invention is a jointless, coherent component made of one piece with the most uninterrupted structure possible.

In other words, the invention is based upon the basic idea that in regions of the micro cooling element in which good heat conductivity, an adapted expansion coefficient and resistance against electrocorrosion are evaluated as prominent material properties, a powdery or liquid material or a material mixture is used and used to form a layered structure which has these material properties, whereas in regions in which the erosion resistance of the material is essential, a material characterised by these properties is used as the base for forming the layers in this region.

At the same time, due to the layered structure and the associated maintenance of a monolithic structure of the component, the formation of joints between the different materials is avoided, and this is associated with a reduction in the density problem, and so in this type of cooling element the required minimum outer wall thickness of the micro cooling element can also be greatly reduced in relation to the wall thicknesses of known copper heat sinks. This means that here too substantially greater coverage is achieved between the region through which a cooling medium, such as for example distilled water, flows and the mounting surface of the component to be cooled, and this is associated with more homogeneous heat exchange and so more effective cooling of the electronic components.

One way of producing a micro cooling element according to the invention offers the process according to the invention for producing a component by means of a layered structure comprising at least two different powdery and/or liquid, in particular metallic and/or ceramic materials, which has the process steps:

1. introducing a material or material mixture into a processing region;
2. distributing the material over the processing region, in particular by means of a levelling device such as to form an even layer;
3. irradiation of the processing region in order to fuse and fix the material on the layer lying beneath;
4. lowering of the processing region; and
5. repetition of steps 1 to 4.

In order to now be able to form the different regions according to their demands from different materials or material combinations, and for this purpose to be able to supply the different materials or material mixtures to the processing region, in the process according to the invention a feeder is provided which has a number of material chambers each of which can respectively be filled with a material having a specific property and which can be supplied to the processing region by a connection line. On the outlet side a dosing unit is respectively assigned to each of the material chambers which makes it possible to set a mix ratio and/or a supply quantity of the different materials for the processing region, and in particular to mix these into a homogeneous mixture in a downstream mixing chamber. Here the mix ratio of the respective materials in the material mixture can take a value of between 0 and 100%, i.e. in other words, on the one hand the supply of different, already pre-mixed materials or material mixtures is possible by means of the material chambers. For this purpose the mixing chambers can be provided with material mixtures with a decreasing portion by weight of a first material or material mixture with at the same time an increasing portion by weight of a second material, and these are supplied one after the other to the processing region, the dosing units enabling supply by opening the individual material chambers. On the other hand however, different materials can also first of all be conveyed out of the material chambers by the dosing units and then, by mixing in particular in a downstream mixing chamber, only the composition of the material mixture is made available for the method step. Of course it is also possible, in particular with materials compatible with one another, to first of all supply and process the one material in its pure form, and then to introduce the second material into the processing region and to add it directly to the solidified first material without forming a continuous crossover zone between the materials. The advantage of the last version is that on the one hand it is possible to use the materials in their pure form so that after completing the components any material remaining the material chambers can be removed in its pure form, and so be stored again. Unlike material mixtures, the materials in pure form can be reused more flexibly. On the other hand, much finer gradation of the composition can be achieved since a separate material chamber in the feeder need not be provided for each composition.

One advantageous embodiment of the method according to the invention makes provision such that, in order to create a homogeneous crossover between two different materials, the mix ratio of the materials to be supplied is changed step by step or continuously from layer application to layer application before being supplied to the processing region. The step by step change to the layer application makes it possible to create a crossover zone between the two different materials without necessarily for this purpose mixing the materials in a mixing chamber. Instead, it is possible, by making available a material mixture before implementing the process and correspondingly filling the mixing chambers in the feeder by step by step supply, firstly of the first pure material, then of the specific material mixture, and finally of the second pure material, to create a homogeneous crossover zone. This procedure is particularly suitable with materials which have at least a small compatibility to one another.

An alternative form of the crossover zone is a continuous change to the mix ratio of the materials to be supplied. By continuously mixing the materials an even more homogeneous crossover is created with which it is also possible to use materials in one component which can not be combined directly, or only very poorly.

In a further embodiment of the process according to the invention provision is made, in order to combine two different materials, in particular materials which are totally incompatible with one another, to use a mediator material which can also be supplied by the feeder continuously or also step by step in order to form a crossover zone. Here, step by step means that after the application of the first material a pure layer of the mediator material is first of all applied, and then the second material is applied onto the mediator material. Continuously means that here too a mixture of the mediator material and the first material is produced, and then the portion of the first material in the material mixture decreases from layer to layer, and in the same way the portion of the second material incompatible with the first material continues to increase in the mixture. Of course it is also conceivable to produce a mixture of the mediator material, the first and second materials directly and to apply these to the last layer of the first material and then apply the second material directly onto the layer formed by the mixture.

Essential for a homogeneous formation of the crossover zone is accurate dosing of the quantity portions of the individual material components. According to the invention, for the setting of a specific mix ratio a feeder according to the invention is used which has a housing in which at least two material chambers are formed which can respectively be filled with one material or one material mixture and to which a dosing unit is respectively assigned on the outlet side. By means of the dosing units it is possible to set a mix ratio and/or the supply quantity of the materials or material mixtures to be supplied to the processing region. In order to obtain the most homogeneous mixture possible between the individual materials or material mixtures, in this case too a mixing chamber adjoins the feeder according to the invention. Particularly accurate setting of a pre-specifiable mix ratio can be achieved if the dosing units of the feeder are computer-controlled.

The feeder according to the invention just described can either form part of an apparatus for producing a component, in particular a micro cooling element, by means of a layered structure comprising at least two different powdery and/or liquid, in particular metallic and/or ceramic materials or material mixtures, or also be fitted subsequently into already existing apparatuses for producing a micro cooling element from just one material so that these apparatuses are also capable of producing multi-component components by means of selective laser melting.

One apparatus according to the invention for producing a component, in particular a micro cooling element, by means of a layered structure comprising at least two different, powdery and/or liquid, in particular metallic and/or ceramic materials or material mixtures with a processing chamber in which a processing space is formed in which the materials or material mixtures can be introduced by means of at least one feeder and at least one radiation source, the radiation of which can be coupled into the processing space, advantageously has a feeder with a number of material chambers which can respectively be filled with a material or material mixture, and to which a dosing unit is respectively assigned on the outlet side by means of which a mix ratio and/or a supply quantity of the material mixtures can be set for the processing space. Also in this apparatus at least one mixing chamber can be located downstream of the dosing units for the homogeneous mixing of the material or material mixture, it also being possible for the dosing unit to be computer-controlled for the accurate setting of a pre-specifiable mix ratio.

In order to be able to reuse for further components material not processed during the process, even after completion of production of the component or micro cooling element, in one exemplary embodiment of the invention separation elements are provided in the processing chamber, which can be positioned in the processing space such that when a material is changed and/or there is a change to the mix ratio, they separate the materials or material mixtures from one another. For this purpose the separation elements to be inserted between the individual materials can be formed as templates so as not to cover the region of the powder layer to be irradiated unnecessarily.

In one advantageous embodiment of the apparatus according to the invention a suction device is provided in order to draw off from the processing space any powdery material not processed, in particular before changing the material to be supplied, for reuse and to prevent any mixing. Of course it is also possible only to use the suction device once the component has been completed in order to draw off the individual materials separated from one another by the template-like separation units, one after the other.

A further advantageous embodiment of the invention makes provision such that after completing the component, the non-processed powder material can be re-supplied to the production process by a preparation unit for reuse. For this purpose the preparation unit can have a sieve for sorting out fused or clumped together material and comprise a powder separation device. A powder separation device can for example be an arrangement containing a magnet. This is advantageous if, for example, one of the materials used in the process is magnetic, and the other not. An alternative separation device is a blower device which is used if powders of very different densities are used. By means of the blower device the individual components can be separated by the powder of smaller density being blown out of the mixture.

Further advantageous embodiments of the invention can be taken from the sub-claims and the following description of an exemplary embodiment by means of the attached drawings. The drawings show as follows:

DETAILED DESCRIPTION

Figure 1:
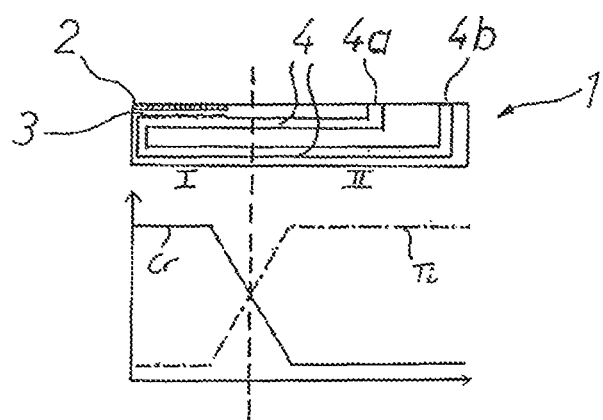
FIG. 1 is a diagrammatic illustration of a micro cooling element according to the invention.

FIG. 1 diagrammatically shows a micro cooling element according to the invention which can roughly be divided into two regions I and II.

In region I a mounting surface 2 for a component to be cooled, such as for example a semiconductor element, is formed on the upper side of the micro cooling element 1 in its front face side end region. Disposed beneath the mounting surface 2 within the micro cooling element 1 is a micro cooling structure 3 which by means of connection channels 4 with inflow and outflow openings 4a, 4b located in region II forms a cooling circuit through which a cooling medium, such as for example deionised water, can flow for cooling purposes. In region I, in particular in the region of the micro cooling structure 3, the requirement for optimal heat exchange comes to the fore. Correspondingly, in this region the most erosion-free material possible, expansion adapted and with good cooling properties is desirable. An example of this type of material is chromium. However, other materials such as nickel, for example, are also possible. Material properties, such as stability for example, play a less important role at this point since only small mechanical stresses occur and so are negligible here.

In region II, however, it is precisely in the region of the water inlet and the water outlet that the mechanical stresses are very high. Relatively high mechanical stresses also occur in the region of the supply and discharge of the cooling water. Therefore in this region a material with a high level of resistance against electrocorrosion and with very good mechanical strength is desirable. These requirements are fulfilled by the use of titanium, for example. Materials such as stainless steel for example can also be used here. The heat conductivity and expansion adaptation which are poorer in relation to chromium are of lesser significance in this region since this region is not involved in the direct heat exchange with the component to be cooled.

Between region I and region II a crossover region C is provided in which, as viewed from region I to region II, the mix ratio is continuously changed such that the chromium content decreases and the titanium content correspondingly increases the more one passes from region I towards region II. By means of the continuous mixture of the two materials a homogeneous crossover is created with which it is possible to combine the materials which can only be combined directly with one another with difficulty. In the event of incompatibility, it is if appropriate possible to incorporate a so-called mediator component between the materials.

Beneath the diagrammatically illustrated micro cooling element 1 the change in the chromium and titanium content in the respective regions of the cooling element is shown diagrammatically as an illustration. As a result, one obtains a cooling element which in the region of the heat exchange is erosion-free, expansion adapted and provided with good cooling properties. In the region of the supply and discharge the cooling element has outstanding resistance against electrocorrosion and very good mechanical strength.

As already mentioned above, the micro cooling element 1 is produced by means of selective laser melting. With this process the component to be produced is first of all separated virtually into sections along the Z plane of the component and the resulting CAD data in the X and Y direction are inputted into a control unit. Furthermore the component is analysed with regard to in which regions which properties are to be prioritised so as to make a material choice accordingly. The micro cooling element 1 according to the invention can now be divided into two requirement regions. As described above, region I relates to the part of the cooling element 1 for which the evacuation of heat is essential since the semiconductor to be cooled is to be fitted in this region. Therefore, the essential properties required of the material here are heat conductivity, expansion adaptation to the component to be cooled and erosion resistance. Electrocorrosion and mechanical stress only play a less important role here. The connection points 4a, 4b for the water supply are located in region II. Since the cooling element 1 is also a component part of the electrical contacting, the focus here is mechanical stability and resistance against electrocorrosion. Requirements such as heat conductivity and expansion adaptation are less important material requirements here.

Figure 2:
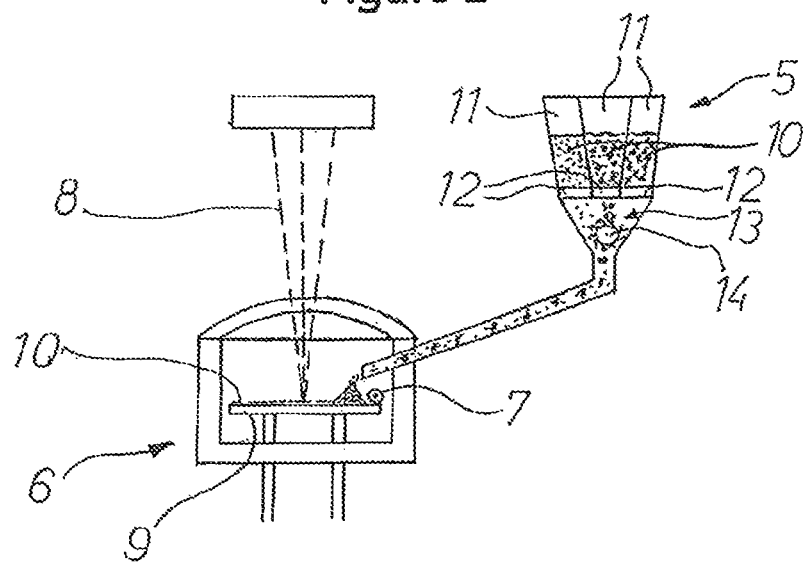
FIG. 2 is a diagrammatic illustration of an apparatus for producing a component by means of selective laser sintering.

For the construction of the micro cooling element 1 according to the invention, upon the basis of the preceding analysis a material with good heat conductivity and heat expansion coefficients adapted to the component to be cooled is first of all selected in order to form region I, and this is introduced into a processing region of a processing chamber 6 by means of a feeder 5 shown in FIG. 2 and then distributed using a levelling device 7, free from binding agents and fluxing agents, and with a pre-specified layer height which corresponds to a penetration depth of a laser beam 8 used in the process, over a base plate 9 which can be lowered in the Z direction in the processing chamber 6. In an inert gas atmosphere the laser beam 8 corresponding to the CAD data inputted into the control unit is moved over the powder layer 10 such that the metallic material powder 10 is heated locally to the melting temperature and totally fused over its whole layer height at the respective striking point of the laser beam 8. Next the base plate 9 is lowered by an amount which corresponds to the layer thickness of the fused metal powder 10. A further layer of the metallic material powder 10 is then applied to the already present metal powder layer 10 treated with laser radiation and the layer thickness of which in turn corresponds to the penetration depth of the laser beam 8.

Supply of the material powder 10 is implemented by means of the feeder 5 according to the invention in which in this exemplary embodiment three material chambers 11 are formed. The one material chamber 11 is filled here with chromium Cr for supply of region I, and the other with titanium Ti for region II, and the third material chamber 11 is provided with a chromium/titanium mixture.

On the outlet side the material chambers 11 are respectively provided with a dosing unit 12 by means of which the mix ratio and the supply quantity of the individual materials 10 can be set simply by opening and closing the opening on the outlet side of the material chamber 11, the dosing units 12 for the supply of the material to the processing chamber 6 freeing the material outlet of the material chamber 11, by means of which the material powder 10 continues to move out of the material chambers 11 due to the force of gravity until the dosing units 12 close once again. In this embodiment the dosing units 12 are computer-controlled for the setting of a pre-specifiable mix ratio, and this results in very accurate setting of the composition of the material mixture 10.

In order to obtain the most homogeneous possible mixing of the material mixture a mixing chamber 13, in which the sample mixture can be mixed intensively once again by means of a worm 14 prior to supply to the processing chamber, is located downstream of the dosing units 12. In order to create the most homogeneous possible crossover zone between the two different materials, the mix ratio of the materials chromium and titanium is changed step by step or continuously from layer application to layer application before supply to the processing region in the processing chamber 6. In this exemplary embodiment the feeder 5 has a further material chamber 11 which in this exemplary embodiment is provided with a chromium/titanium material mixture, but in the case of materials which are totally incompatible with one another can also be provided with a mediator component (not shown) which can then be incorporated in the crossover region for combining the materials. It is also conceivable to fill the third material chamber with a material mixture optimal for the crossover zone with a further material different from chromium and titanium which can be produced in the forefield outside of the apparatus. This is advantageous if the crossover region also requires a constant mix ratio or the mediator material is only a very small portion in an only very small field of application.

In order to form the workpiece the laser beam 8 is now moved in a number of traces over the pre-specified region of the material layers 10 so that each subsequent trace of the laser beam at least partially overlaps the previous trace. By means of the overlapping the fused material of the powder 10 and the fused material of the adjacent, already solidified, solid contour which was previously fused, and beneath the subsequently applied powder layer, is fused to form a common molten pool. The molten pool then undergoes a metal melting alliance. In this way, after solidification a homogeneous grid structure with a high level of strength and density and without any grooves or other crossover points is formed.

If the micro cooling element 1 with the two main regions I, II, was totally constructed in this way, it is then only necessary to remove the powder remaining in the inner structures. This can be achieved, for example, by means of compressed air or by the micro cooling element then being flushed with pressurised deionised water.

Since by means of this process the most different of metallic material powders can also be processed in combination, in addition to the combination of metallic materials, a combination of metallic and ceramic materials is also conceivable. The use of liquid metallic or ceramic materials, if required also in combination with powdery materials, is also conceivable.

The invention claimed is:

1. A micro cooling element comprising:
   a top surface and a bottom surface, the top surface defining a mounting area for receiving a component to be cooled; and
   a micro cooling structure disposed beneath the mounting area and between the top surface and the bottom surface, the micro cooling structure including a channel having an inlet and an outlet for a cooling medium to flow therethrough, the inlet and the outlet being formed through the top surface;
   wherein the micro cooling element is formed as a monolithic structure having a first region and a second region, the first region being a thermally stressed area and comprising one of a metallic and a ceramic material, the second region being a mechanically stressed area and comprising one of a metallic and a ceramic material different than the one of the metallic and ceramic material of the first region.

2. The micro cooling element of claim 1, wherein the component is a semiconductor.

3. The micro cooling element according to claim 1, wherein the first region comprises chromium or nickel and the second region comprises titanium.

4. The micro cooling element according to claim 1, wherein the micro cooling element includes a cross over region between the first and second regions in which a mix ratio is continuously changed such that the content of the one of the metallic and ceramic materials of the first region decreases and the content of the one of the metallic and ceramic materials of the second region increases from the first region to the second region.

5. The micro cooling element according to claim 4, wherein a mediator material is applied in the cross over region.

* * * * *